United States Patent [19]

Fudem

[11] Patent Number: 5,819,169
[45] Date of Patent: *Oct. 6, 1998

[54] HIGH PERFORMANCE MIXER STRUCTURES FOR MONOLITHIC MICROWAVE INTEGRATED CIRCUITS

[75] Inventor: Howard N. Fudem, Baltimore, Md.

[73] Assignee: Northrop Grumman Corporation, Los Angeles, Calif.

[*] Notice: This patent issued on a continued prosecution application filed under 37 CFR 1.53(d), and is subject to the twenty year patent term provisions of 35 U.S.C. 154(a)(2).

[21] Appl. No.: 644,792

[22] Filed: May 10, 1996

[51] Int. Cl.$^6$ ...................................................... H04B 1/26
[52] U.S. Cl. ............................................ 455/326; 455/317
[58] Field of Search ........................... 455/3.2, 311, 317, 455/318, 319, 325, 326, 330, 333

[56] References Cited

U.S. PATENT DOCUMENTS

| | | | |
|---|---|---|---|
| 4,323,855 | 4/1982 | Gerlach | 331/56 |
| 4,355,421 | 10/1982 | Seely | 455/330 |
| 4,375,699 | 3/1983 | Hallford | 455/327 |
| 4,430,758 | 2/1984 | Snyder | 455/227 |
| 4,435,848 | 3/1984 | Sedlmair | 455/327 |
| 4,485,488 | 11/1984 | Houdart | 455/327 |
| 4,560,964 | 12/1985 | Meier | 333/202 |
| 4,627,104 | 12/1986 | Knochel | 455/327 |
| 4,954,790 | 9/1990 | Barber | 332/164 |
| 4,994,755 | 2/1991 | Titus et al. | 330/54 |
| 5,025,232 | 6/1991 | Pavio | 333/26 |
| 5,060,298 | 10/1991 | Waugh et al. | 455/333 |
| 5,061,910 | 10/1991 | Bouny | 333/26 |
| 5,175,885 | 12/1992 | Lange et al. | 455/323 |
| 5,179,728 | 1/1993 | Sowadski | 455/317 |
| 5,194,833 | 3/1993 | Dougherty et al. | 333/33 |
| 5,361,409 | 11/1994 | Vice | 455/333 |
| 5,428,838 | 6/1995 | Chang et al. | 455/333 |
| 5,428,839 | 6/1995 | Friesen et al. | 455/333 |
| 5,428,840 | 6/1995 | Sadhir | 455/333 |

OTHER PUBLICATIONS

Shigaki et al., "One–Chip GaAs Monolithic Frequency Converter Operable to 4GHz", IEEE Transactions on Microwave Theory amd Techniques, vol. 36, No. 4, Apr. 1988.

*Primary Examiner*—Nguyen Vo
*Assistant Examiner*—Marsha D. Banks-Harold
*Attorney, Agent, or Firm*—Terry Anderson; Karl J. Hoch, Jr.

[57] ABSTRACT

Mini-microstrip and mini-coplanar transmission lines are formed on a ship substrate with two metal layers. Together with a ground plane on the underside of the substrate, the lines are connected to form a Marchand balun. Two baluns, a quarter-wave transmission line and a diode quad are combined on a chip to form an MMIC mixer, and a par of mixers are combined with 90° and 180° splitters to provide circuits with superior rejection of specific spurious signals as well as RF and LO leakage over.

9 Claims, 7 Drawing Sheets

FIG. 6g

HIGH PERFORMANCE MIXER STRUCTURES FOR MONOLITHIC MICROWAVE INTEGRATED CIRCUITS

FIELD OF THE INVENTION

This invention relates to monolithic microwave integrated circuits (MMICs), and more particularly to an MMIC mixer using Marchand baluns and arranged to suppress RF and LO leakage as well as spurious intermodulation distortion products.

BACKGROUND OF THE INVENTION

Gallium arsenide (GaAs) integrated circuit technology is commonly used in constructing miniaturized microwave devices for aerospace and other applications. One type of balun which is suitable for use in GaAs MMICs is a Marchand balun which is typically implemented on a chip with three metal layers on which the transmission lines forming the Marchand balun are positioned.

A representative prior art design for an MMIC Marchand balun is shown in U.S. Pat. No. 5,025,232 to Pavio. That design uses a series open stub for increased bandwidth, but that design creates an extra loss which it would be desirable to eliminate. It also requires an extra dielectric layer which is not included in the standard MMIC process used by most manufacturers thereby increasing cost and complexity.

One use of Marchand baluns is in microwave mixers. Integrated circuit microwave mixers have been proposed in many forms. One problem with such mixers is radio frequency (RF) and local oscillator (LO) frequency leakage as well as the generation of spurious intermodulation signals. These problems have been addressed in the past, as for example by U.S. Pat. No. 4,994,755 to Titus et al., but not in a passive balun environment.

Although the prior art mixers have proven generally suitable for their intended purposes, they possess inherent deficiencies which detract from their overall effectiveness and desirability.

As such, although the prior art has recognized to a limited extent the problem of leakage and intermodulation distortion, the proposed solutions have, to date, been ineffective in providing a satisfactory remedy.

SUMMARY OF THE INVENTION

The present invention specifically addresses and alleviates the above mentioned deficiencies associated with the prior art. More particularly, the present invention comprises a Marchand-type balun using capacitor-coupled mini-microstrip or mini-coplanar structures formed on a three-metal-layer MMIC chip which can be fabricated with a standard MMIC process. A pair of such baluns are used to feed a diode quad forming the core of a double-balanced mixer. The LO balun is shunted by a quarter wavelength transmission line which acts as an open circuit at the LO frequency and a short circuit at the intermediate frequency (IF). Series capacitors are added between the LO balun and the diode quad to eliminate loading of the low frequency IF port by the LO balun.

A pair of these mixers, together with combinations of 0°, 90° and 180° hybrids are used to create spurious rejection mixers with superior LO and RF leakage suppression characteristics and an improved system dynamic range due to suppression of spurious intermodulation signals.

These as well as other advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 3 is a plan view of a Marchand balun using the construction of FIG. 2a;

DESCRIPTION OF THE PREFERRED EMBODIMENTS

The detailed description set forth below in connection with the appended drawings is intended as a description of the presently preferred embodiments of the invention, and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Figure 1:
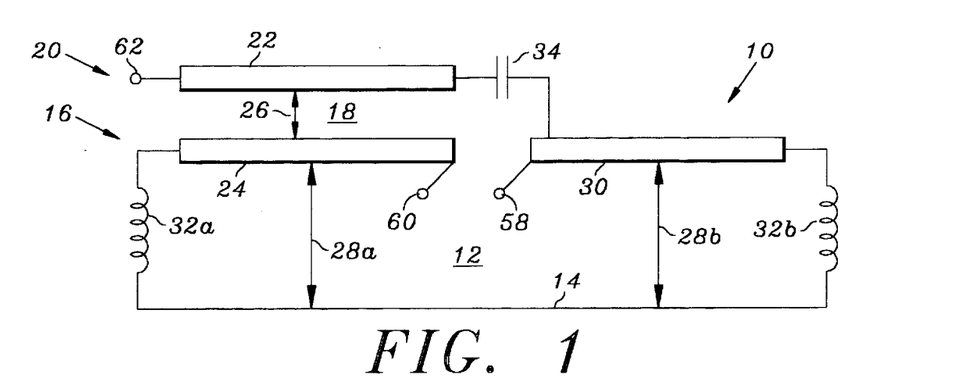
FIG. 1 is a schematic representation of an MMIC Marchand balun.

FIG. 1 illustrates the basic layout of an MMIC Marchand balun 10. A GaAs chip substrate 12 has a metallic ground plane 14 formed on its underside and a first metal layer 16 on its top. A dielectric layer 18 is formed over the first metal layer 16, and a second metal layer 20 is formed over the dielectric layer 18. The metal layers 16 and 20 are etched to create circuit elements which cooperate with each other and with the ground plane 14 to constitute the Marchand balun circuit structure depicted schematically in FIG. 1.

Microstrip 22 formed in the second metal layer 20 and microstrip 24 formed in the first metal layer 16 together constitute a first microwave transmission line 26. Microstrip 24 and the ground plane 14 together constitute a second transmission line 28a; and a microstrip 30 formed in the first metal layer 16, together with the ground plane 14, forms a third transmission line 28b. The microstrips 24 and 30 are connected at their outer ends to the ground plane 14 by substrate vias which have inherent inductances 32a and 32b, respectively. The single input to the balun 10 is at the outer end of microstrip 22, while the balanced outputs are the inner ends (60 and 58) of microstrips 24 and 30, respectively. A coupling capacitor 34 interconnects the inner ends of microstrips 22 and 30.

Figure 2A:
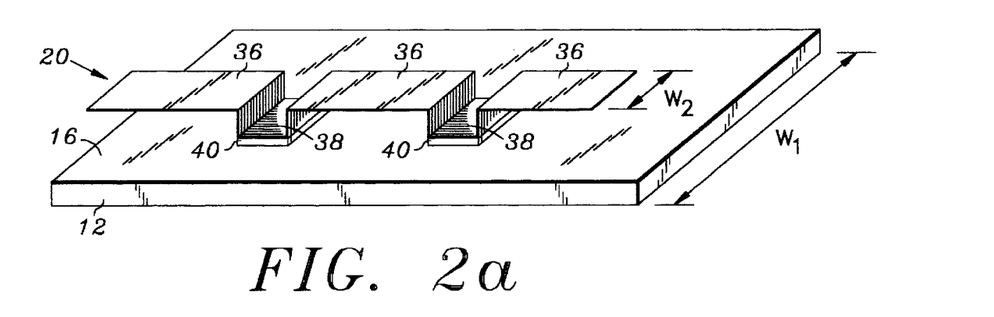
FIG. 2a is a perspective view of an inventive mini-microstrip transmission line construction.
Figure 2B:
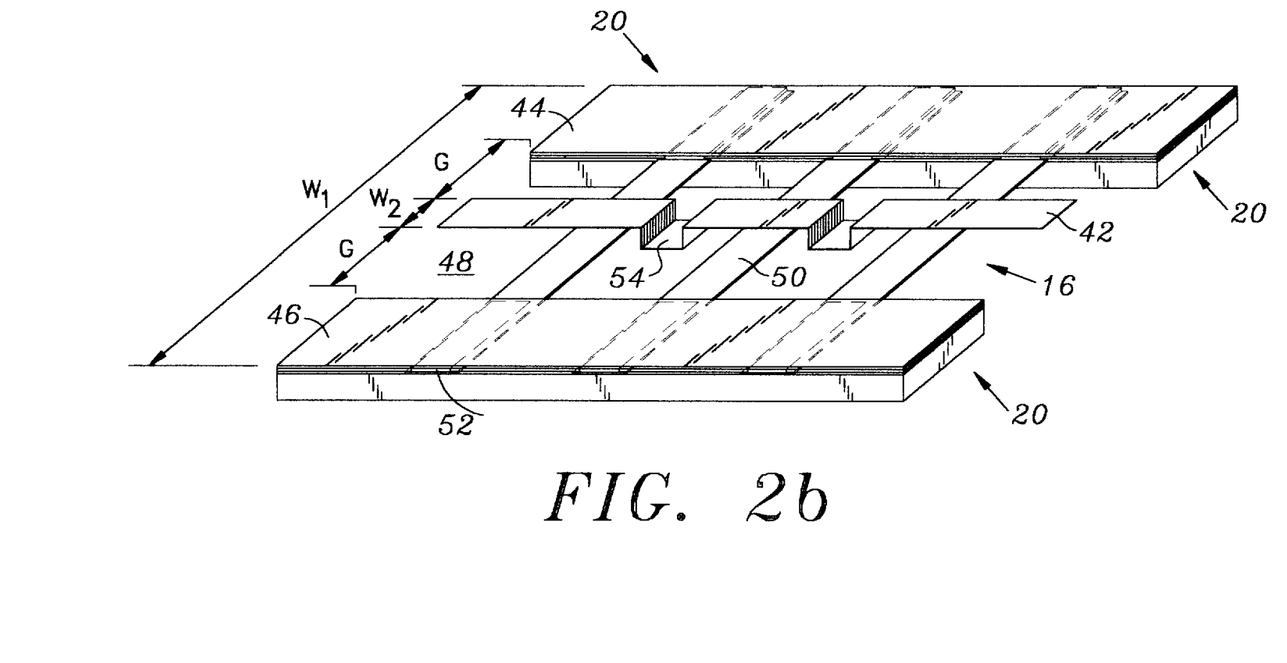
FIG. 2b is a perspective view of an inventive mini-coplanar transmission line construction.

FIGS. 2a and 2b illustrate two ways of forming MMIC transmission lines in accordance with this invention. In FIG. 2a, mini-microstrip transmission lines are formed by depositing on the substrate 12 a first layer of metal 16 and then, using an appropriate manufacturing technique such as that described in U.S. Pat. No. 5,194,833 to Dougherty et al., forming airbridges 36 in a second metal layer 20. Underneath the airbridges 36, the dielectric layer 18 of FIG. 1 is preferably removed to provide an air dielectric constant $\epsilon_r=1$, for the transmission lines formed by the airbridges 36 and the metal layer 16.

The airbridges 36 are supported by capacitor posts 38 which are depressed portions of the metal layer 20 resting on dielectric pads 40 formed on top of the metal layer 16. The pads 40 preferably have a dielectric constant of about $\epsilon_r=6.6$ or lower so that the posts 38 coact with the metal layer 16 to form capacitors.

In a typical embodiment of the invention, the first metal layer 16 may have a width $W_1$ on the order of 40 μm, while the width $W_2$ of the airbridges can be varied depending upon the desired impedance level.

FIG. 2b shows mini-coplanar transmission lines formed in accordance with the invention. In that figure, the transmission lines are wholly in the second metal level 20 and consist of a central airbridge conductor 42 positioned between two ground plane lines 44, 46 and separated from them by gaps 48. The first metal layer 16 in this embodiment is reduced to connector strips 50 which interconnect the ground plane lines 44 and 46 to keep them at the same electrical potential. The ground plane lines 44, 46 and the connector strips 50 are connected by contact pads 52, while the airbridges are supported on the substrate 12 by posts 54. With this construction, the overall width $W_1$ of the transmission line structure can be on the order of 48 μm, while the width $W_2$ of the center conductor 42 and the width G of the gaps 48 can again be adjusted to provide a desired impedance.

Figure 3:
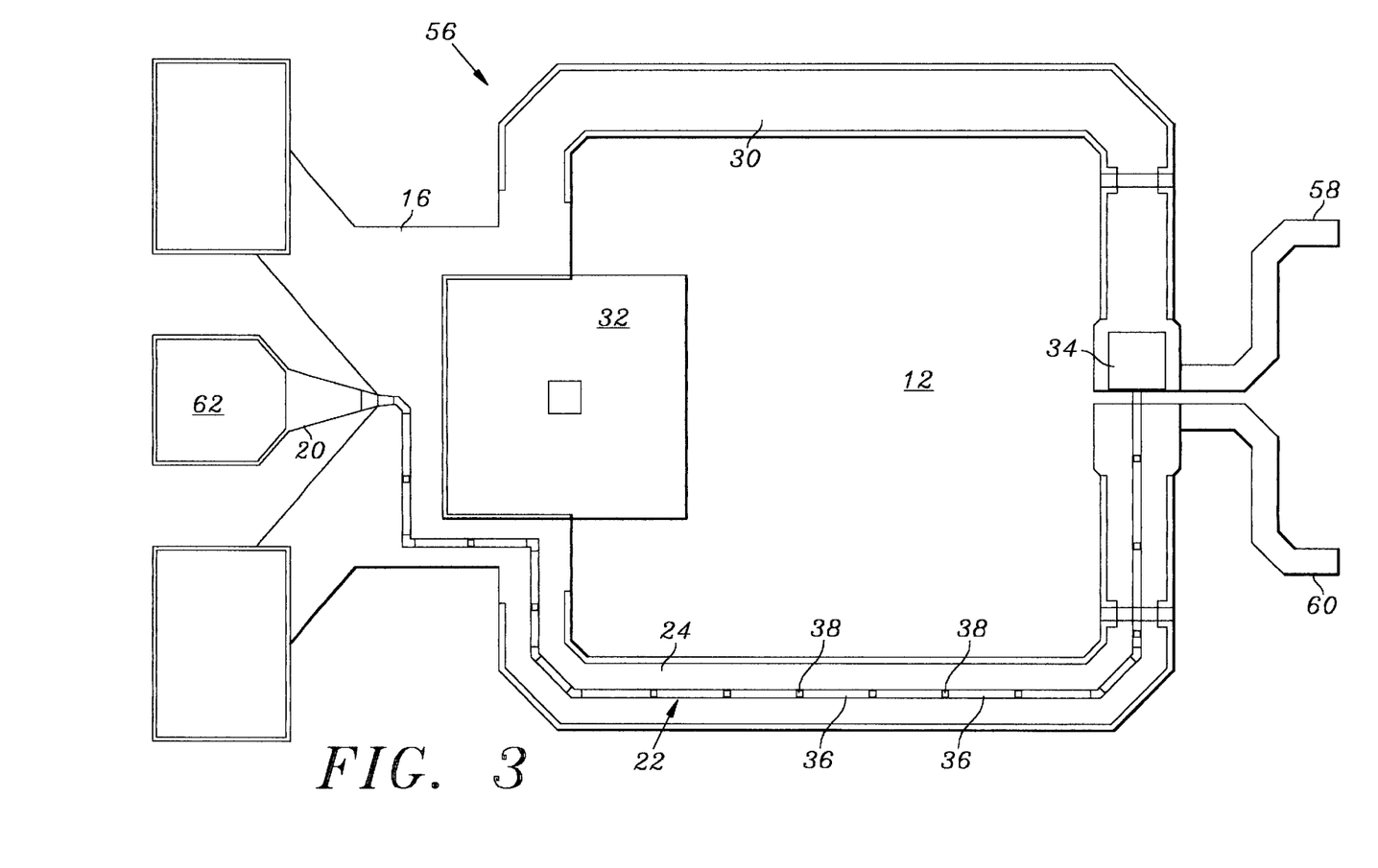

FIG. 3 shows an MMIC Marchand balun 56 using the mini-microstrip structure of FIG. 2a. In that figure, the conductors 30 and 24 of FIG. 1 as well as the balanced outputs 58, 60 are formed in the first metal layer 16, while the input 62 and the microstrip airbridges 36 and capacitor posts 38 which constitute the conductor 22 of FIG. 1 are formed in the second metal layer 20. The coupling capacitor 34 capacitively interconnects the first and second metal layers at the output end of conductor 30. A substrate via 32 connects the left ends (in FIG. 3) of conductors 24 and 30 to the ground plane 14 (not visible in FIG. 3) on the underside of substrate 12. The single via 32 of FIG. 3 is a combination of the vias 32a and 32b of FIG. 1. Extra second metal is used along the edges of the conductors 24 and 30 because high frequency currents tend to concentrate along the edge of the conductor. The extra edge metal thus reduces losses.

Figure 4:
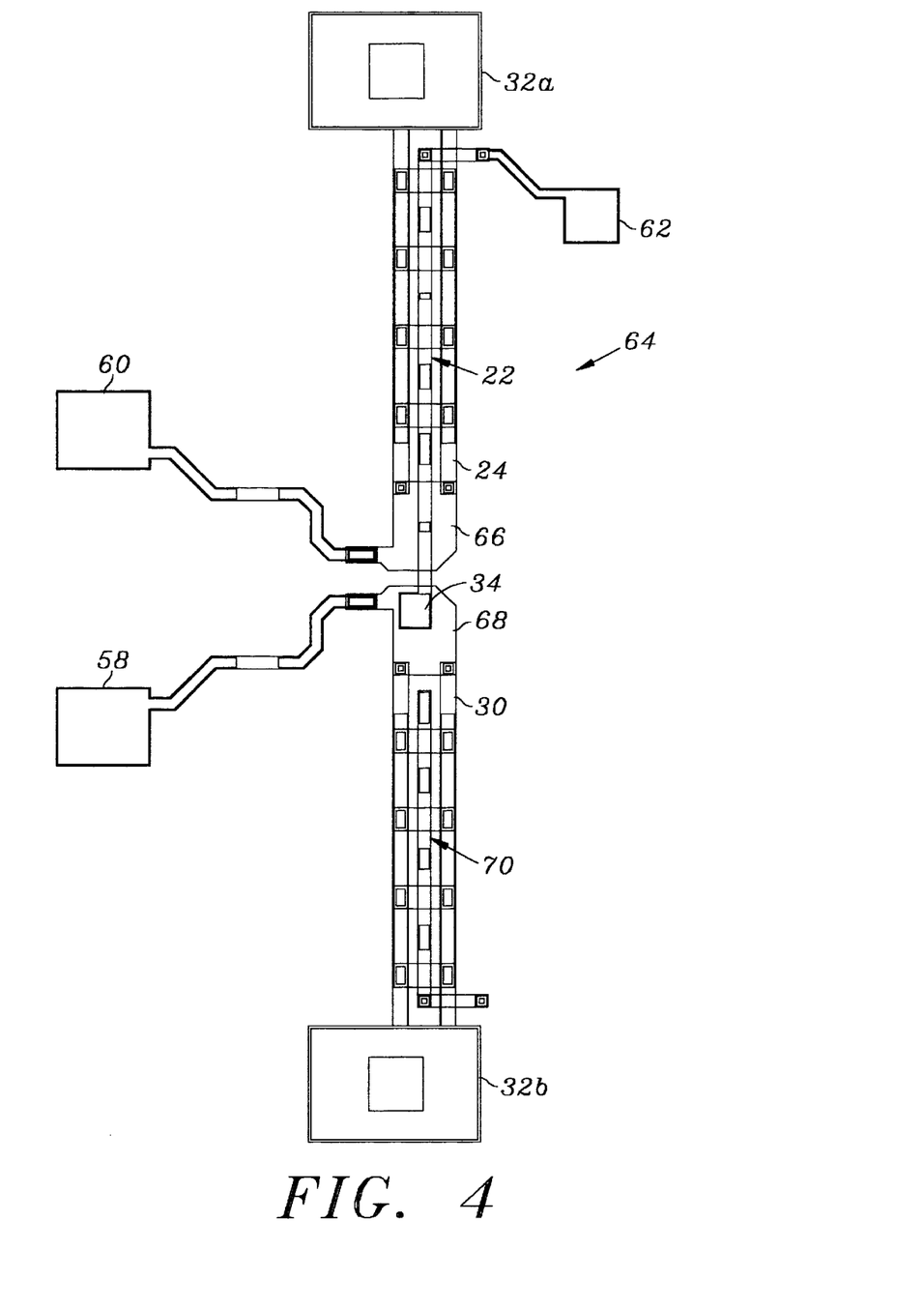
FIG. 4 is a plan view of a Marchand balun using the construction of FIG. 2b.

FIG. 4 shows an MMIC Marchand balun 64 using the mini-coplanar transmission line construction of FIG. 2b. This construction uses two separate substrate vias 32a and 32b, and the conductors 30 and 24 of FIG. 1 are formed by the combination of the first metal layer portions 66, 68 and the second metal layer ground plane lines 44, 46. For fabrication and symmetry reasons, the center conductor 70 may be structurally present but it is not connected to anything. In both the constructions of FIGS. 3 and 4, a typical substrate thickness of 100 μm will produce an input impedance of about 55 Ω in the configurations shown.

Figure 5A:
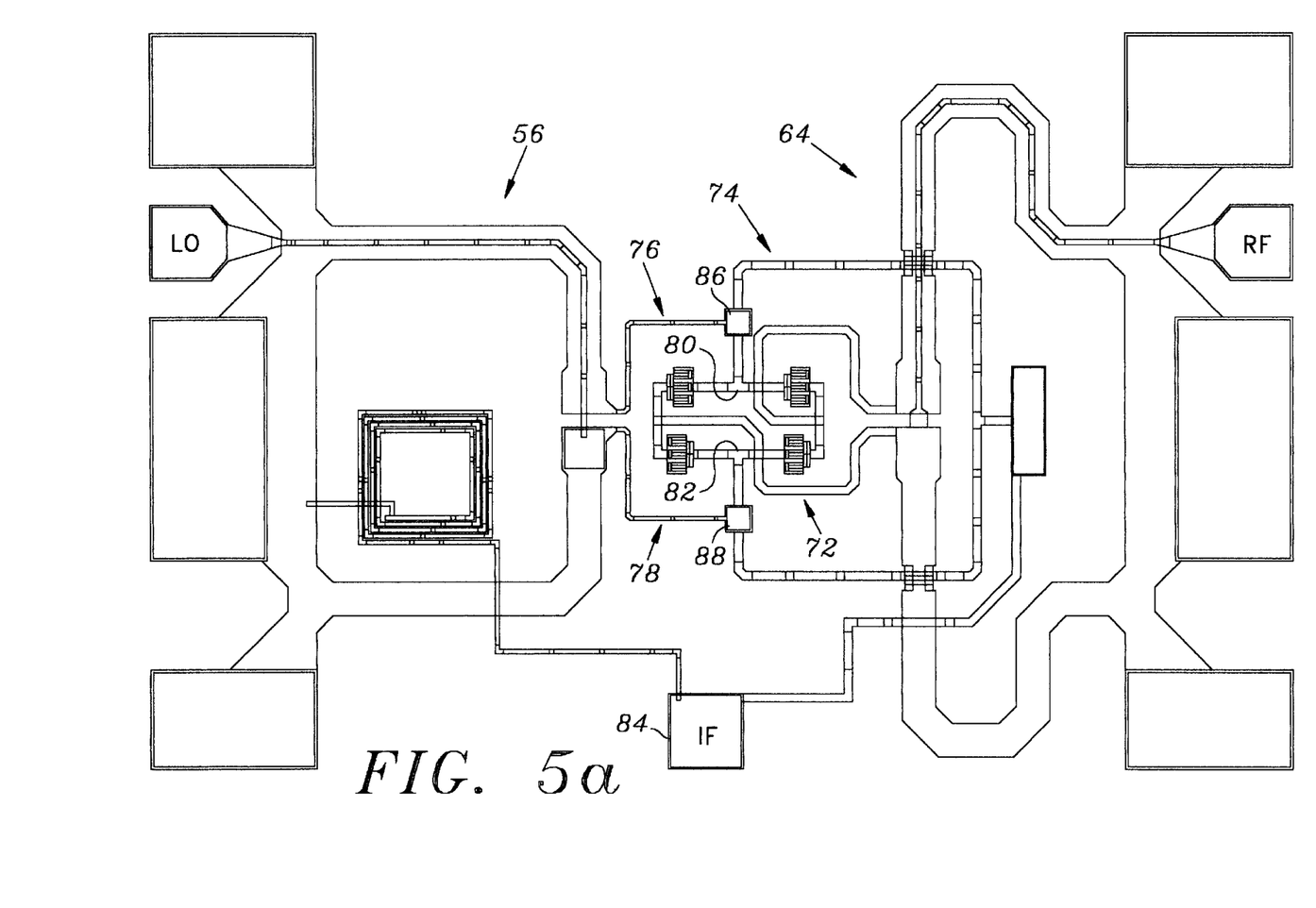
FIG. 5a is a plan view of a mixer using baluns in accordance with FIG. 3.

FIG. 5a illustrates an MMIC mixer using the baluns of FIG. 3. The baluns 56 and 64 feed a diode quad 72 forming the core of a double-balanced mixer. A transmission line 74 about a quarter-wavelength long shunts the outputs 76, 78 of the LO balun 56. The line 74 is an open circuit at the LO frequency but a short circuit at the IF. As a result, the LO output is applied to junctions 80, 82 of the diode quad 72 while the junctions 80, 82 are connected together at the IF to feed the IF output 84. Series capacitors 86, 88 are added between the LO balun 56 and the diode quad 72 to eliminate loading of the IF port 84 by the LO balun 56. Ground plane connections may be made from the contact pads 85, 87 to the ground plane on the underside of the substrate by vias (not shown) or ground ribbons (not shown) extending from the contact pads 85, 87 to the ground plane to form the connections 32a, 32b of FIG. 1. A square spiral inductor 89 is used to match the IF port 84 to a 50 Ω system impedance over the desired frequency band.

Figure 5B:
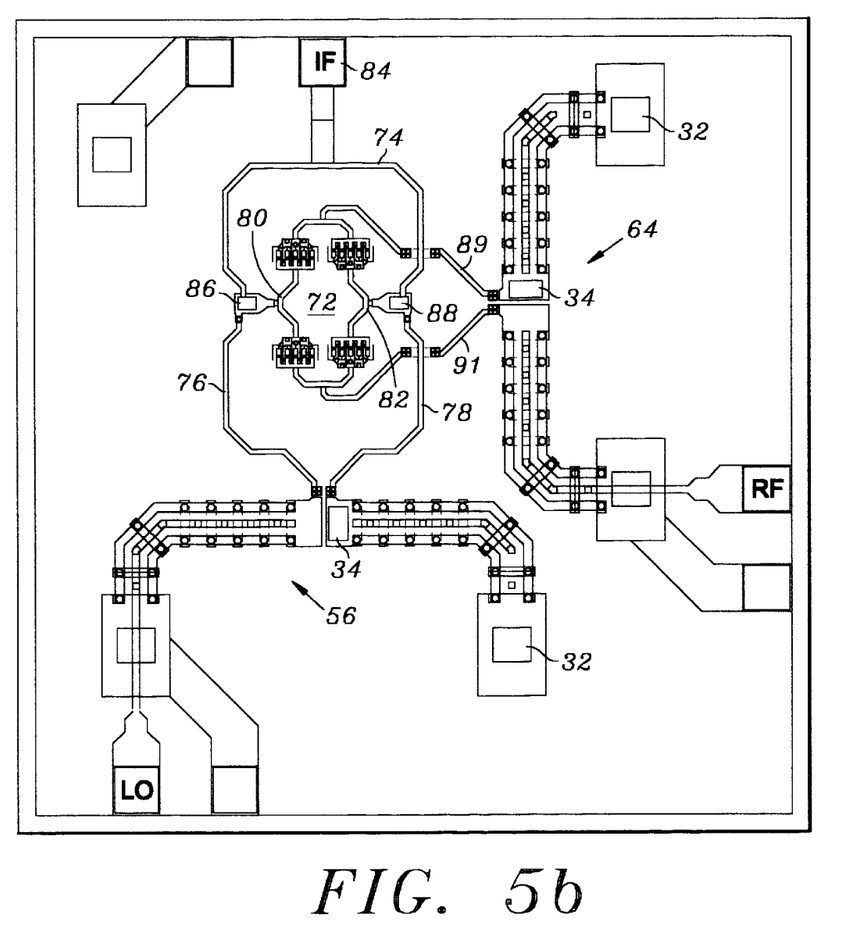
FIG. 5b is a plan view of a mixer using baluns in accordance with FIG. 4.

FIG. 5b shows a mixer using the mini-coplanar transmission lines of FIGS. 2b and 4. The electrical structure of the mixer of FIG. 5b is the same as that of the mixer of FIG. 5a, and like reference numerals designate like parts of the circuit discussed above in connection with FIG. 5a. The lines 89, 91 in the mixer of FIG. 5b connect the output of RF baluns 64 to the diode quad 72. The length of these lines is adjusted for impedance matching to the diode quad.

The baluns 56 and 24 are physically orthogonal in order to shorten all the lengths of lines 74, 76–78, and 89, 91 connecting the diode quad to its surrounding circuitry. This helps to ensure reliable high frequency operation. All transmission lines are so disposed as to maintain circuit symmetry about the diode quad. This results in very good isolation and spurious signal suppression.

Figure 6A:
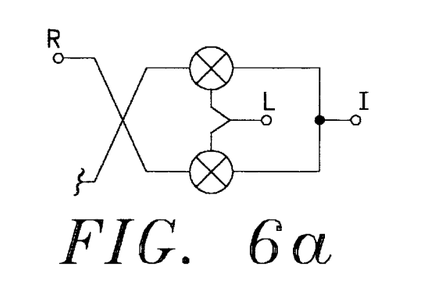
FIGS. 6a–6g are two-mixer configurations for the suppression of various spurious signals.
Figure 6B:
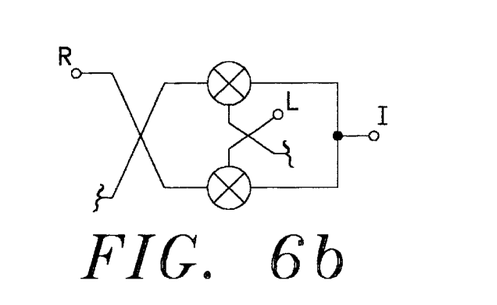
Figure 6C:
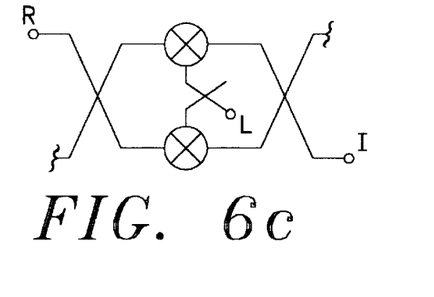
Figure 6D:
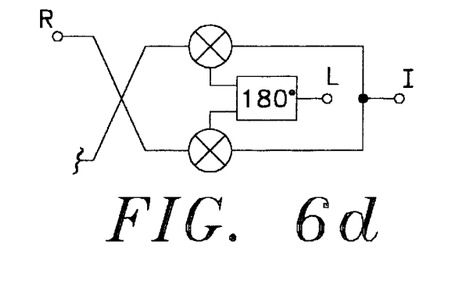
Figure 6E:
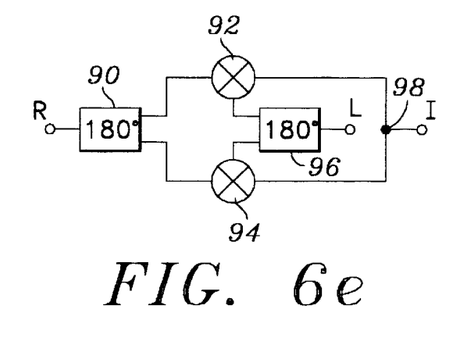
Figure 6F:
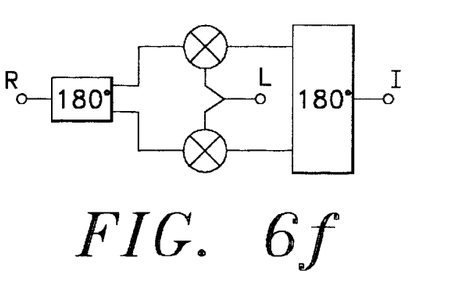
Figure 6G:
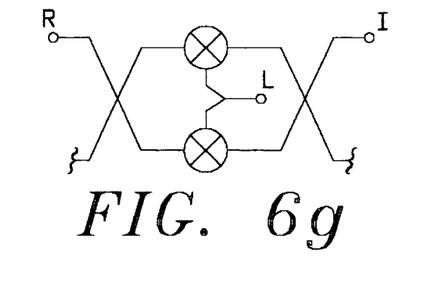

FIGS. 6a through 6g show various novel configurations using two mixers and different combinations of 0°, 90°, 180° hybrids to create spurious signal rejection mixers. The most common type of spurious signal rejection mixer is an image rejection mixer. Such a mixer is shown in FIG. 6g. This configuration cancels the image of a signal. The other configurations shown in FIGS. 6a–6f provide additional suppression of LO and RF leakage. These configurations also provide suppression of spurious intermodulation signal, thus giving greater dynamic range to the system configurations.

For example, in FIG. 6e, a 180° hybrid 90 is connected to the RF ports of two mixers 92, 94, a 180° hybrid 96 connects the two LO ports, and a 0° combiner 98 is used for the two IF ports. The desired IF signal at each of the mixers 92, 94 is in phase as shown in equations (1) and (2).

$$I_{42}=[R-L] \tag{1}$$

$$I_{44}=[(R-180°)-(L-180°)]=[R-L] \tag{2}$$

The LO leakage at the IF port of mixer 92 is L, and the LO leakage at the IF port of mixer 94 is L-180°. When these two signals are combined in the IF port 0° combiner 98 they cancel, thus providing additional LO suppression above that already supplied by a double-balanced mixer.

In the case of an R-2L spurious product, equation (3) and (4) show the signals at each IF port.

$$I_{52}=[R-2L] \tag{3}$$

$$I_{94}=[(R-180°)-2*(L-180°)]=[(R-180°)-2L-360°]=[R-2L-180] \tag{4}$$

Again, these two signals cancel in the 0° combiner 98.

Equations (1) and (2) are equally applicable to RF leakage R at the IF ports, and equations (3) and (4) can be expanded in a similar manner to cover spurious products of the general type nR±mL. It will be readily seen that the circuit of FIG. 6e will cancel L, R and any nR±mL signal in which n+m is an odd number.

Applying the same analysis to the configurations of FIGS. 6a–6d, 6f and 6g, it will be seen that these configurations cancel spurious signals in the IF output as follows FIG. 6a: nR±mL if n is even and m is even or odd;
FIG. 6b: L and Image. Used as an up-converter;
FIG. 6c; L, and nR-mL if n+m is odd;
FIG. 6d: L, and nR±mL if n+m is even;
FIG. 6f: L, and nR±mL if n is even and m is even or odd;
FIG. 6g: Image In the circuits of FIGS. 6a, 6c and 6d, the IF output is down 3 db as compared to the other circuits. This may or may not be a factor in selecting one of the circuits of FIGS. 6a–6g over another.

It is understood that the exemplary monolithic microwave integrated circuit transmission lines, baluns and mixers described herein and shown in the drawings represent only presently preferred embodiments of the invention. Indeed, various modifications and additions may be made to such embodiments without departing from the spirit and scope of the invention. Thus, other modifications and additions may be obvious to those skilled in the art and may be implemented to adapt the present invention for use in a variety of different applications.

I claim:

1. A monolithic microwave integrated circuit mixer, comprising:
    a) a local oscillator input, a radio frequency input, and an intermediate frequency output;
    b) a diode quad having two pairs of junctions;
    c) a first balun formed with mini-microstrip transmission lines having its input connected to said local oscillator input and its balanced outputs connected to a first pair of junctions of said diode quad;
    d) a quarter wavelength transmission line interconnecting said first pair of junctions and said intermediate frequency output, said local oscillator frequency and said intermediate frequency being such that said transmission line is substantially an open circuit at the local oscillator frequency but a short-circuit at the intermediate frequency so as to isolate said first pair of junctions from each other and from said intermediate frequency output at the local oscillator frequency but connect them to each other and to said intermediate frequency output at the intermediate frequency; and
    e) a second balun formed with mini-coplanar transmission lines and having its input connected to said radio frequency input, and its balanced output connected to the second pair of junctions of said diode quad.

2. The mixer of claim 1, in which coupling capacitors are interposed between said balanced outputs of said first balun and said first pair of junctions.

3. A monolithic microwave integrated circuit mixer circuit for cancelling spurious signals, comprising:
    a) first and second mixers, each having a radio frequency input, a local oscillator input and an intermediate frequency output;
    b) a local oscillator providing a local oscillator signal L, a radio frequency source providing a radio frequency input R, and an intermediate frequency terminal; and
    c) at least one phase splitter;
    d) said phase splitters being so connected to said radio frequency source, local oscillator source, mixers and intermediate frequency terminal to cancel at said intermediate frequency terminal mixer-produced signals of the general form nR±mL, in which n, m, and n+m have predetermined parities, and R and L are, respectively, the radio frequency and local oscillator signals applied to said circuit; and
    e) a 90° phase splitter being interposed between said radio frequency source and the radio frequency inputs of said mixers, and said local oscillator source and said intermediate frequency terminal being connected in the same phase, respectively, to the local oscillator inputs and the intermediate frequency outputs of said mixers.

4. A monolithic microwave integrated circuit mixer circuit for cancelling spurious signals, comprising;
    a) first and second mixers, each having a radio frequency input, a local oscillator input and an intermediate frequency output;
    b) a local oscillator providing a local oscillator signal L, a radio frequency source providing a radio frequency input R, and an intermediate frequency terminal; and
    c) at least one phase splitter;
    d) said phase splitters being so connected to said radio frequency source, local oscillator source, mixers and intermediate frequency terminal to cancel at said intermediate frequency terminal mixer-produced signals of the general form nR±mL, in which n, m, and n+m have predetermined parities, and R and L are, respectively, the radio frequency and local oscillator signals applied to said circuit; and
    e) a 90° phase splitter being interposed between said radio frequency source and the radio frequency inputs of said mixers, a 90° phase splitter being interposed between said local oscillator source and the local oscillator inputs of said mixers, and a same-phase connection being made between the intermediate frequency outputs of said mixers and said intermediate frequency terminal.

5. A monolithic microwave integrated circuit mixer circuit for cancelling spurious signals, comprising:
    a) first and second mixers, each having a radio frequency input, a local oscillator input and an intermediate frequency output;
    b) a local oscillator providing a local oscillator signal L, a radio frequency source providing a radio frequency input R, and an intermediate frequency terminal; and
    c) at least one phase splitter;
    d) said phase splitters being so connected to said radio frequency source, local oscillator source, mixers and intermediate frequency terminal to cancel at said intermediate frequency terminal mixer-produced signals of the general form nR±mL, in which n, m, and n+m have predetermined parities, and R and L are, respectively, the radio frequency and local oscillator signals applied to said circuit; and
    e) a 90° phase splitter being interposed between said radio frequency source and the radio frequency inputs of said mixers, a 90° phase splitter being interposed between said local oscillator source and the local oscillator inputs of said mixers, and a 90° phase splitter being interposed between the intermediate frequency outputs of said mixers and said intermediate frequency terminal.

6. A monolithic microwave integrated circuit mixer circuit for cancelling spurious signals, comprising:
    a) first and second mixers, each having a radio frequency input, a local oscillator input and an intermediate frequency output;
    b) a local oscillator providing a local oscillator signal L, a radio frequency source providing a radio frequency input R, and an intermediate frequency terminal; and
    c) at least one phase splitter;
    d) said phase splitters being so connected to said radio frequency source, local oscillator source, mixers and intermediate frequency terminal to cancel at said intermediate frequency terminal mixer-produced signals of the general form nR±mL, in which n, m, and n+m have predetermined parities, and R and L are, respectively, the radio frequency and local oscillator signals applied to said circuit; and e) a 90° phase splitter being interposed between said radio frequency source and the radio frequency inputs of said mixers, a 180° phase splitter being interposed between said local oscillator source and the local oscillator inputs of said mixers, and a same-phase connection being made between the intermediate frequency outputs of said mixers and said intermediate frequency terminal.

7. A monolithic microwave integrated circuit mixer circuit for cancelling spurious signals, comprising:

a) first and second mixers, each having a radio frequency input, a local oscillator input and an intermediate frequency output;

b) a local oscillator providing a local oscillator signal L, a radio frequency source providing a radio frequency input R, and an intermediate frequency terminal; and c) at least one phase splitter;

d) said phase splitters being so connected to said radio frequency source, local oscillator source, mixers and intermediate frequency terminal to cancel at said intermediate frequency terminal mixer-produced signals of the general form nR±mL, in which n, m, and n+m have predetermined parities, and R and L are, respectively, the radio frequency and local oscillator signals applied to said circuit; and e) a 180° phase splitter being interposed between said radio frequency source and the radio frequency inputs of said mixers, a 180° phase splitter being interposed between said local oscillator source and the local oscillator inputs of said mixers, and a same-phase connection being made between the intermediate frequency outputs of said mixers and said intermediate frequency terminal.

8. A monolithic microwave integrated circuit mixer circuit for cancelling spurious signals, comprising:

a) first and second mixers, each having a radio frequency input, a local oscillator input and an intermediate frequency output;

b) a local oscillator providing a local oscillator signal L, a radio frequency source providing a radio frequency input R, and an intermediate frequency terminal; and c) at least one phase splitter;

d) said phase splitters being so connected to said radio frequency source, local oscillator source, mixers and intermediate frequency terminal to cancel at said intermediate frequency terminal mixer-produced signals of the general form nR±mL, in which n, m, and n+m have predetermined parities, and R and L are, respectively, the radio frequency and local oscillator signals applied to said circuit; and e) a 180° phase splitter being interposed between said radio frequency source and the radio frequency inputs of said mixers, a same-phase connection being made between said local oscillator source and the local oscillator inputs of said mixers, and a 180° phase splitter being interposed between the intermediate frequency outputs of said mixers and said intermediate frequency terminal.

9. A monolithic microwave integrated circuit mixer circuit for cancelling spurious signals, comprising:

a) first and second mixers, each having a radio frequency input, a local oscillator input and an intermediate frequency output;

b) a local oscillator providing a local oscillator signal L, a radio frequency source providing a radio frequency input R, and an intermediate frequency terminal; and c) at least one phase splitter;

d) said phase splitters being so connected to said radio frequency source, local oscillator source, mixers and intermediate frequency terminal to cancel at said intermediate frequency terminal mixer-produced signals of the general form nR±mL, in which n, m, and n+m have predetermined parities, and R and L are, respectively, the radio frequency and local oscillator signals applied to said circuit; and e) a 90° phase splitter being interposed between said radio frequency source and the radio frequency inputs of said mixers, a same-phase connection being made between said local oscillator source and the local oscillator inputs of said mixers, and a 90° phase splitter being interposed between the intermediate frequency outputs of said mixers and said intermediate frequency terminal.

\* \* \* \* \*